(12) United States Patent
Natsuhara et al.

(10) Patent No.: US 6,653,604 B2
(45) Date of Patent: Nov. 25, 2003

(54) HEATER MEMBER FOR MOUNTING HEATING OBJECT AND SUBSTRATE PROCESSING APPARATUS USING THE SAME

(75) Inventors: Masuhiro Natsuhara, Itami (JP); Hirohiko Nakata, Itami (JP); Akira Kuibira, Itami (JP); Kenji Shinma, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/119,812

(22) Filed: Apr. 9, 2002

(65) Prior Publication Data

US 2003/0015516 A1 Jan. 23, 2003

(30) Foreign Application Priority Data

Apr. 11, 2001 (JP) ........................................ 2001-112903

(51) Int. Cl.[7] ................................................ H05B 3/68
(52) U.S. Cl. ................................................ 219/444.1
(58) Field of Search .................... 219/443.1, 444.1, 219/450.1, 544, 546, 547, 548; 118/724, 725, 728, 621; 392/418

(56) References Cited

U.S. PATENT DOCUMENTS

| 5,978,202 | A | * | 11/1999 | Wadensweiler et al. .... 361/234 |
| 6,458,444 | B1 | * | 10/2002 | Natsuhara et al. .......... 428/141 |
| 6,465,763 | B1 | * | 10/2002 | Ito et al. .................. 219/444.1 |
| 6,538,872 | B1 | * | 3/2003 | Wang et al. ................ 361/234 |

FOREIGN PATENT DOCUMENTS

| JP | 06076924 | 3/1994 |
| JP | 10242252 | 9/1998 |

* cited by examiner

Primary Examiner—Sang Paik
(74) Attorney, Agent, or Firm—W. F. Fasse; W. G. Fasse

(57) ABSTRACT

In the heater member for mounting an object of heating, at least a part of a surface other than a surface mounting a substrate such as a semiconductor wafer or a substrate for liquid crystal, is mirror-finished. Accordingly, power fed to the heater for heating to a prescribed temperature can be reduced, and thus, a heater member for mounting an object of heating and a substrate processing apparatus using the heater member, that can heat the object with higher efficiency, can be obtained.

19 Claims, 2 Drawing Sheets

HEATER MEMBER FOR MOUNTING HEATING OBJECT AND SUBSTRATE PROCESSING APPARATUS USING THE SAME

BACKGROUND OF THE INVENTION

1. Field of the Invention

The present invention relates to a heater member for mounting an object of heating, and to a substrate processing apparatus using the same.

2. Description of the Background Art

Various heaters have been proposed for mounting and heating objects of heating. For example, a heater containing, as a main component, aluminum nitride having high thermal conductivity and high thermal uniformity in the heater, and a heater using alumina, which is inexpensive, have been known. In order to efficiently heat the objects of heating, various shapes and the like have been proposed for such heaters.

SUMMARY OF THE INVENTION

An object of the present invention is to provide a heater member for mounting an object of heating and a substrate processing apparatus using the same, that can reduce power to be fed to the heater necessary for heating to a prescribed temperature and that can heat the object of heating with higher efficiency.

According to the present invention, the heater member for mounting an object of heating is characterized in that at least a part of a surface other than an object mounting surface is mirror-finished.

The inventors made various attempts to realize efficient heating of the object, and have found that surface roughness of the heater on which the object is mounted has a significant influence on the heating of the object.

For example, assume that a power is fed to a resistance heater embedded in an insulator such as ceramic to generate heat. The Joule's heat generated thereby is transmitted through the ceramic to the object, and heats the object. Transmission of the heat to the object of heating is attained by heat transfer, radiation and convection.

At a surface other than the object mounting surface of the heater member, however, the heat is transmitted to the peripheral portion, i.e. the surroundings, by radiation and convection. Therefore, it is necessary for the heater member to generate, by Joules heat, such a quantity of heat that is the sum of the heat for heating the heater member itself, the heat for heating the object and the heat transmitted to the peripheral portion. As a method of reducing the quantity of heat transmitted to the peripheral portion among the required heat quantity, the inventors have found that it is effective to mirror-finish at least a part of the surface other than the object heating surface of the heater member.

More specifically, Joule's heat generated by the resistance heater is transmitted through the ceramic and heats the ceramic itself. Thereafter, when the heat is radiated to the peripheral portion and the ceramic surface is mirror-finished, it has been found that the heat that is to be radiated at the surface of the ceramic is reflected and again taken into the ceramic. Thus, the heat radiated outward from the heater member reduces, enabling efficient heating of the object.

Preferably, in the heater member for mounting the object, at least a part of the surface opposite to the object mounting surface is mirror-finished.

Assuming that the heater member is of the same temperature entirely, the effect attained by the mirror-finishing is in proportion to the mirror-finished area. Thus, when the surface opposite to the object mounting surface is mirror-finished, a large mirror-finished area can be ensured, and the quantity of heat radiated from the heater member to the outside can significantly be reduced.

Therefore, all the surfaces other than the object mounting surface of the heater member may be mirror-finished. This can maximize the effect of mirror-finishing.

In the heater member for mounting an object described above, the surface roughness of the mirror-finished portion is $Ra \leq 0.2$ μm.

The surface roughness is set to $Ra \leq 0.2$ μm, as the ratio of reflection of the heat generated in the heater at the surface lowers and the quantity of radiation at the peripheral portion of the heater member becomes relatively large when the surface roughness exceeds 0.2 μm.

Preferably, in the heater member for mounting an object of heating, the surface roughness of the mirror-finished portion is $Ra \leq 0.05$ μm.

When the surface roughness is made at most 0.05 μm, the amount of radiation to the peripheral portion of the heater member can more significantly be reduced.

The surface roughness of the object mounting surface is not specifically limited. When the object mounting surface is mirror-finished, for example, adhesion with the object of heating improves, and therefore, heat transmission through contact increases as compared with heat transmission by radiation. When the surface roughness is not at the level of mirror-finish, the quantity of heat transmission attained by heat transfer lowers, while the quantity of heat transmitted through radiation increases. Therefore, the surface roughness of the object mounting surface does not have much influence as compared with the surfaces other than the object mounting surface.

When the object of heating is in tight contact with the heater member, it is preferred that the object mounting surface is also mirror-finished, with the surface roughness being $Ra \leq 0.2$ μm (more preferably, $Ra \leq 0.05$ μm). Here, when the object mounting surface is mirror-finished, contact area between the heater member and the object increases, and therefore heat can be transmitted more efficiently from the heater member to the object.

When it is the case that the object is simply placed (positioned) on the heater member and the substrate mounting surface is mirror-finished, reflection of Joule's heat, that is the effect of the present invention, occurs, and hence transmission of heat to the object will be hindered.

Therefore, in order to attain tight contact between the object and the heater member, the heater member and the object of heating may brought into tight contact by mechanically pressing the protruding surfaces of these two by means of a clamp at an outer peripheral portion, or by electrostatic chuck, for example.

In the heater member for mounting an object of heating described above, the object includes a semiconductor wafer and a liquid crystal substrate.

Thus, efficient heating of a semiconductor wafer or a liquid crystal substrate becomes possible, and processing such as film formation on the substrates can be done efficiently.

The substrate processing apparatus in accordance with the present invention employs the heater member for mounting the object of heating described above, and heats and processes, as the object of heating, a semiconductor wafer or a liquid crystal substrate.

Thus, the semiconductor wafer or a substrate for liquid crystal can be heated efficiently as described above, and hence, a substrate processing apparatus can be provided that enables efficient processing such as film formation on such substrates.

In the present invention, the material of the heater is not particularly limited. For example, a heater having a resistance heater embedded in an insulator such as ceramic, or a heater having a heating body such as nichrome covered by a metal sheet may be used. Various heaters may be selected dependent on the intended application.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the figures.

First Embodiment

Figure 1:
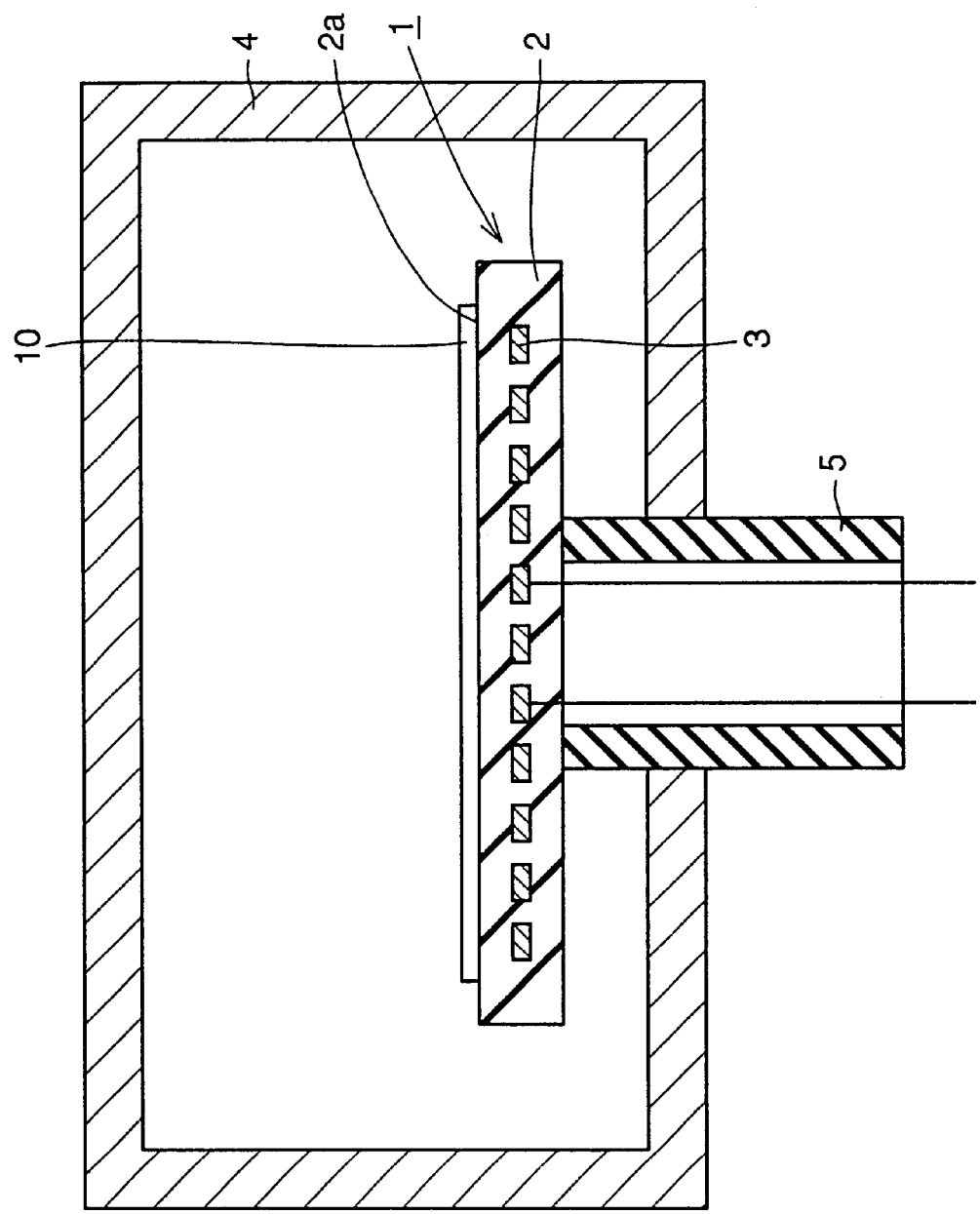
FIG. 1 is a schematic cross section representing a structure of a substrate processing apparatus using a heater member for mounting an object of heating, in accordance with a first embodiment of the present invention.

Referring to FIG. 1, a ceramic module 1 corresponding to the heater member for mounting an object of heating has a ceramic base body 2, and a resistance heater 3 embedded in the ceramic base body 2.

On a substrate mounting surface 2$a$ of ceramic base body 2, a substrate 10 such as a semiconductor wafer or a substrate for liquid crystal is mounted. At least a part of a surface other than the substrate mounting surface 2$a$ of ceramic module 1 is mirror-finished. More preferably, the surface opposite to the substrate mounting surface 2$a$ of ceramic module 1 is partially or entirely mirror-finished.

A pipe 5 is connected to the center of the side opposite to the substrate mounting surface 2$a$ of ceramic module 1, and by pipe 5, ceramic module 1 is supported in a chamber 4.

Preferably, the surface roughness of the mirror-finished portion is Ra$\leq$0.2 $\mu$m, and more preferably, Ra$\leq$0.05 $\mu$m.

Second Embodiment

Figure 2:
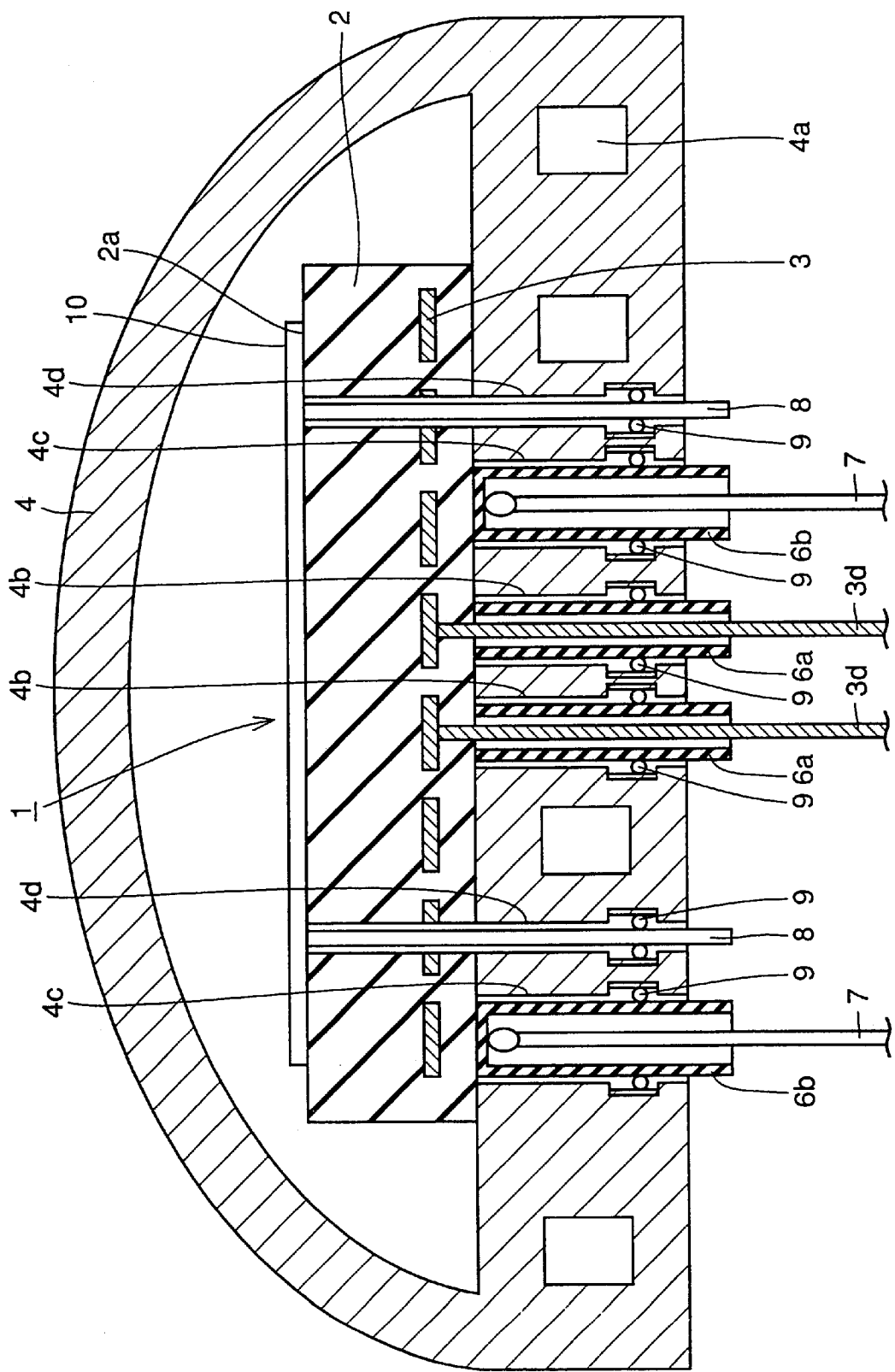
FIG. 2 is a schematic cross section representing a structure of a substrate processing apparatus using a heater for mounting an object of heating, in accordance with a second embodiment of the present invention.

Referring to FIG. 2, the substrate processing apparatus of the present embodiment is different from the substrate processing apparatus shown in FIG. 1, in that a flat, plate shaped ceramic module 1 is directly in contact with and supported by chamber 4, not connected through a pipe to the chamber 4.

In the substrate processing apparatus of this type, again, at least a part of the surface other than the substrate mounting surface 2$a$ of ceramic module 1 is mirror-finished. In this structure, it is preferred that the surface of ceramic base body 2 that is in contact with chamber 4 of ceramic module 1 is mirror-finished. Further, the surface of chamber 4 which is in contact with ceramic base body 2 may be mirror-finished.

Preferably, the surface roughness of the mirror-finished portion is, as in the first embodiment, Ra$\leq$0.2 $\mu$m and, more preferably, Ra<0.05 $\mu$m.

The structure of the substrate processing apparatus in accordance with the present embodiment other than this point will be described in the following.

In the contact surface between ceramic module 1 and chamber 4, there are a plurality of through holes 4$b$, 4$c$ and 4$d$, passing through chamber 4. Through hole 4$b$ is provided for inserting, from the outside of chamber 4, a power supply conductive member 3$d$ that is electrically connected to resistance heater 3. Through hole 4$c$ is provided for inserting, from the outside of chamber 4, a temperature measurement sensor, for example, a thermocouple 7, for measuring the temperature of ceramic base body 2, to be close to ceramic base body 2. Through hole 4$d$ is provided for inserting, from the outside of the chamber, a push pin 8 for pushing up the substrate 20 mounted on ceramic module 1. Ceramic module 1 is provided with a through hole through which push pin 8 is passed.

Power supply conductive member 3$d$ electrically connected to resistance heater 3 has its periphery covered by a coating member 6$a$ at least in chamber 4. Thus, corrosion of resistance heater 3 by gas or plasma in chamber 4 is prevented. Coating member 6$a$ is of the same material as ceramic base body 2. An O-ring 9 is provided between outer circumferential surface of coating member 6$a$ and inner circumferential surface of through hole 4$b$, to attain air-tight sealing.

Thermocouple 7 as the temperature measurement sensor also has its periphery covered by coating member 6$b$ at least in chamber 4, so that corrosion by gas or plasma in chamber 4 is prevented. Coating member 6$b$ is of the same material as ceramic base body 2. An O-ring 9, for example, is provided between the outer circumferential surface of coating member 6$b$ and the inner circumferential surface of through hole 4$c$, to attain air-tight sealing.

Each of the through holes 4$b$ and 4$c$ is air-tightly sealed, as ceramic base body 2 is in contact with chamber 4.

An O-ring 9 is provided between the outer circumference of push pin 8 and inner circumference of through hole 4$d$, to attain air-tight sealing.

In the vicinity of a portion where ceramic module 1 is arranged in chamber 4, a liquid cooling apparatus 4$a$ using a coolant such as water is provided. The cooling apparatus 4$a$ is not limited to a liquid cooling apparatus, and it may be a cooling apparatus provided with a fin or a fan, for example.

Preferably, the substrate processing apparatuses of the first and second embodiments above are used for performing processes on a substrate such as a semiconductor wafer or a transparent substrate for liquid crystal, for example, performing processes including CVD (Chemical Vapor Deposition) using plasma, CVD under low pressure, CVD for forming a metal layer, CVD for forming an insulating layer, ion implantation and etching. The application, however, is not limited thereto. The heater member for mounting an object of heating in accordance with the present invention is similarly applicable to general heaters that mount and heat objects of heating.

As to the material of ceramic base body 2 of the first and second embodiment, preferably, it is aluminum oxide (alumina), aluminum nitride, silicon nitride or silicon carbide, or an arbitrary combination of these. More preferable material is aluminum nitride. When the material of ceramic base body 2 is aluminum nitride, it is preferred that ceramic base body contains sintering assistant agent including a rare earth. The rare earth included in the sintering assistant agent is preferably yttrium, and the content of the sintering assistant agent is, preferably, at least 0.05 mass % and at most 1.0 mass %.

The material of the heater member for mounting an object of heating in accordance with the present invention is not limited to ceramic as mentioned above, and the heater may be mainly formed of other insulator or a conductor.

Though an example in which resistance heater 3 only is used as an electric circuitry has been described in the first and second embodiments, the resistance heater 3 may be combined with an electrode for electrostatic chuck or an RF electrode.

Examples of the present invention will be described in the following.

EXAMPLE 1

A silver-palladium (Ag—Pd) paste is applied to each of alumina ($Al_2O_3$) substrate, an aluminum nitride substrate and a silicon nitride substrate, each having the diameter of 220 mm×thickness of 2 mm, thus providing resistance heaters. Thereafter, substrates of the same material are joined by glass on the resistance heaters, the surfaces are polished, and ceramic heaters were thus fabricated.

As an object to be mounted on each ceramic heater, a silicon wafer having the diameter of 200 mm×thickness of 1.0 mm was prepared. Further, a thermocouple was attached to one surface of the silicon wafer, so as to enable monitoring of the wafer temperature. Various samples of the ceramic heaters with the surface roughness of all the surfaces other than the wafer mounting surface changed variously were prepared, as shown in Table 1. Here, samples having Ra=0.2 $\mu$m and 0.1 m had mirror-finished surfaces.

Thereafter, the surface not provided with the thermocouple of each silicon wafer is placed on each ceramic heater, and placed in vacuum. Output (power fed to the heater) to the heater when the wafer was at 450° C. was found. The surface roughness of the wafer mounting surface was, in each example, Ra=0.8 $\mu$m. The results of experiment are as shown in Table 1.

TABLE 1

| Ceramic | Surface Roughness other than Wafer Mounting Surface (Ra:$\mu$m) | Heater Output (W) |
| --- | --- | --- |
| AlN | 0.8 | 825 |
| AlN | 0.5 | 719 |
| AlN | 0.2 | 583 |
| AlN | 0.1 | 551 |
| $Al_2O_3$ | 0.8 | 931 |
| $Al_2O_3$ | 0.5 | 787 |
| $Al_2O_3$ | 0.2 | 602 |
| $Al_2O_3$ | 0.1 | 575 |
| $Si_3N_4$ | 0.8 | 831 |
| $Si_3N_4$ | 0.5 | 748 |
| $Si_3N_4$ | 0.2 | 590 |
| $Si_3N_4$ | 0.1 | 561 |

From the results shown in Table 1, it can be seen that when the surface other than the object mounting surface of the heater is mirror-finished (Ra$\leq$0.2 $\mu$m), the power to be fed to the heater for heating to the same temperature can be reduced, as compared with samples that are not mirror-finished.

EXAMPLE 2

An electric circuit is formed by nichrome, covered by a metal plate having the diameter of 220 mm and the thickness of 0.8 mm, and magnesia powder was filled between the nichrome and the metal plate to ensure insulation. All the surfaces other than the object mounting surface of the resulting heater samples were changed variously in the similar manner as in Example 1, and outputs to the heaters (power fed to the heaters) were measured. The results are as shown in Table 2. Here, examples having Ra=0.2 $\mu$m and 0.1 $\mu$m had mirror-finished surfaces. The surface roughness of the wafer mounting surface was, in every sample, Ra=0.5 $\mu$m.

TABLE 2

| Type of Metal Plate | Surface Roughness other than Wafer Mounting Surface (Ra: $\mu$m) | Heater Output (W) |
| --- | --- | --- |
| Al | 0.8 | 921 |
| Al | 0.5 | 807 |
| Al | 0.2 | 621 |
| Al | 0.1 | 603 |
| Ni | 0.8 | 959 |
| Ni | 0.5 | 829 |
| Ni | 0.2 | 638 |
| Ni | 0.1 | 619 |
| Stainless steel | 0.8 | 942 |
| Stainless steel | 0.5 | 818 |
| Stainless steel | 0.2 | 630 |
| Stainless steel | 0.1 | 611 |

From the results shown in Table 2, it can be seen that even when the heater material is metal, when the surfaces other than the object mounting surface are mirror-finished (Ra$\leq$0.2 $\mu$m), the power fed to the heater for heating to the same temperature can be reduced as compared with the samples that are not mirror-finished.

EXAMPLE 3

Among the heaters fabricated in Example 1, those formed of aluminum nitride were placed in vacuum chamber in a semiconductor manufacturing apparatus, a silicon wafer having the diameter of 200 mm and the thickness of 1.0 mm was mounted on each of the heaters, and a film was formed by CVD method. At this time, the temperature of the silicon wafer was controlled to 450° C. After the end of film formation, the silicon wafers were observed. Satisfactory film was formed on every wafer. The power consumption of the heater at 450° C. was almost the same as Example 1, and it was at most 10W in any of the samples.

EXAMPLE 4

Among the heaters fabricated in Example 1, those formed of aluminum nitride were placed in a vacuum chamber of a liquid crystal substrate manufacturing apparatus, a glass substrate having the diameter of 200 mm and the thickness of 0.1 mm was mounted on each of the heaters, and a film was formed by the CVD method. At this time, the temperature of the glass substrate was controlled to 450° C. After the end of film formation, the glass substrate was observed, and satisfactory film was formed on every glass substrate. The power consumption of the heater at 450° C. at this time (power fed to the heater) was as shown in Table 3.

TABLE 3

| Ceramic | Surface Roughness other than Wafer Mounting Surface (Ra: μm) | Heater Output (W) |
|---|---|---|
| AlN | 0.8 | 983 |
| AlN | 0.5 | 852 |
| AlN | 0.2 | 689 |
| AlN | 0.1 | 644 |

As can be seen from the results of Table 3, power consumption can significantly be reduced when surfaces other than glass substrate mounting surface are mirror-finished.

As described above, by the heater member for mounting an object of heating and the substrate processing apparatus using the same in accordance with the present invention, the power fed to the heater for heating to a prescribed temperature can be reduced, and the object can be heated with higher efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heater member for mounting an object of heating, wherein:

said heater member includes a resistance heating body, only a second surface of said heater member opposite to a first surface of said heater member adapted to mount said object of heating thereon is mirror-finished, and a surface roughness of said mirror-finished surface is Ra≦0.2 μm.

2. The heater member for mounting an object of heating according to claim 1, wherein said surface roughness of said mirror-finished surface is Ra≦0.05 μm.

3. The heater member for mounting an object of heating according to claim 1, wherein said object of heating is a semiconductor wafer or a substrate for a liquid crystal mounted on said first surface.

4. A substrate processing apparatus including the heater member for mounting an object of heating according to claim 1, wherein a semiconductor wafer or a substrate for a liquid crystal is heated and processed as the object of heating.

5. The heater member for mounting an object of heating according to claim 1, wherein said first surface is a top surface and said second surface is a bottom surface of said heater member.

6. The heater member for mounting an object of heating according to claim 1, wherein an entire area of said second surface is mirror-finished to have said surface roughness of Ra≦0.2 μm.

7. The heater member for mounting an object of heating according to claim 1, wherein a majority of a total area of said second surface is mirror-finished to have said surface roughness of Ra≦0.2 μm.

8. The heater member for mounting an object of heating according to claim 1, wherein said mirror-finished second surface is a free exposed surface that is not in contact with another member.

9. The heater member for mounting an object of heating according to claim 1, wherein said surface roughness is Ra<0.1 μm.

10. The heater member for mounting an object of heating according to claim 1, wherein said surface roughness is Ra<0.05 μm.

11. The heater member for mounting an object of heating according to claim 1, further including a ceramic body, in which said resistance heating body is embedded.

12. A heater arrangement for heating an object to be heated, said heater arrangement comprising:

a base body having a first major surface including an object mounting area adapted to receive the object mounted thereon, a second major surface opposite said first major surface, and a side surface extending between said first major surface and said second major surface; and an electric resistive heating element received and enclosed in said base body;

wherein, among said surfaces, only said second major surface includes a mirror-finished surface area defined as having a surface roughness of Ra≦0.2 μm, at a location opposite said object mounting area of said first major surface.

13. The heater arrangement according to claim 12, wherein said first major surface is a top surface and said second major surface is a bottom surface of said base body.

14. The heater arrangement according to claim 12, wherein said mirror-finished surface area covers at least a majority of a total area of said second major surface.

15. The heater arrangement according to claim 12, wherein said mirror-finished surface area covers an entire total area of said second major surface.

16. The heater arrangement according to claim 12, wherein said mirror-finished surface area is a free exposed surface area that is not in contact with another member.

17. The heater arrangement according to claim 12, wherein said surface roughness is Ra<0.1 μm.

18. The heater arrangement according to claim 12, wherein said surface roughness is Ra<0.05 μm.

19. The heater arrangement according to claim 12, wherein said base body is a ceramic body, in which said resistive heating element is embedded.

* * * * *